United States Patent [19]

Crawley et al.

[11] Patent Number: 4,849,668
[45] Date of Patent: Jul. 18, 1989

[54] EMBEDDED PIEZOELECTRIC STRUCTURE AND CONTROL

[75] Inventors: Edward F. Crawley, Arlington; Javier de Luis, Boston, both of Mass.

[73] Assignee: Massachusetts Institute of Technology, Cambridge, Mass.

[21] Appl. No.: 51,945

[22] Filed: May 19, 1987

[51] Int. Cl.[4] ............................................. H01L 41/08
[52] U.S. Cl. .................................... 310/328; 310/326; 310/330; 310/331; 310/340; 310/339; 310/316; 310/317; 29/25.35
[58] Field of Search ............... 310/328, 316, 317, 326, 310/330-332, 340, 338, 339

[56] References Cited

U.S. PATENT DOCUMENTS

| | | | |
|---|---|---|---|
| 2,511,624 | 6/1950 | D'halloy | 310/340 |
| 2,558,563 | 6/1951 | Janssen | 310/331 X |
| 4,054,808 | 10/1977 | Tahaka | 310/326 X |
| 4,127,788 | 11/1978 | Daugherty | 310/338 X |
| 4,197,479 | 4/1980 | Gudzin | 310/331 X |
| 4,217,781 | 8/1980 | Abts | 310/338 |
| 4,370,583 | 1/1983 | Ljung | 310/331 |
| 4,400,642 | 8/1983 | Kiraly | 310/332 |
| 4,431,934 | 2/1984 | Kleinschmidt et al. | 310/328 X |
| 4,651,046 | 3/1987 | Ohya et al. | 310/328 |

OTHER PUBLICATIONS

AIAA,/ASME/ASCE/AHS 27th Structures, Structural Dynamics and Materials Conference, Part I, pp. 116-124, Experimental Verifications of Distributed Piezoelectric Actuators for Use in Precision Space Structures, E. F. Crawley & J. De Luis (1986).

Space Systems Laboratory Report SSL#20-85. The Use of Peizo-Ceramics as Distributed Actuators in Flexible Space Structures, J. de Luis and E. F. Crawley, 1985.

Primary Examiner—Mark O. Budd
Attorney, Agent, or Firm—Lahive & Cockfield

[57] ABSTRACT

A composite structural member includes multiple layers with one or more embedded piezoelectric elements. In a conductive member, an insulating sheath electrically isolates each piezoelectric element while mechanically coupling it to the surrounding layers, forming a unitary structure with substantially homogeneous mechanical properties. In a graphite fiber composite structure, the piezoelectric elements are fitted in recesses in one or more interior layers, and located away from strain nodes of the structural members. Preferably pairs of elements are placed on opposite sides of a node and are driven in opposing phases to induce displacement of the structure. In a preferred prototype structure Kapton film insulates the piezoelectric elements, maintaining its integrity during a high temperature, high pressure curing process. An acrylic cement secures the insulator to the elements. Systems according to the invention include vibration damping systems, and aerodynamic lift surfaces or RF reflective surfaces with high authority control. A tubular truss member with axial control characteristics is described.

11 Claims, 2 Drawing Sheets

EMBEDDED PIEZOELECTRIC STRUCTURE AND CONTROL

The Government has rights in this invention pursuant to Grant Number NAGW-21 awarded by the National Aeronautics and Space Administration.

TECHNICAL FIELD

The present invention relates to the fabrication of structural members, by which is meant structures having a definite shape and formed of a material having defined mechanical properties. More particularly, the invention relates to the fabrication and control of structures having high stiffness and mechanical strength, and to methods of varying the properties of such a structure in a dynamic or hostile environment. In particular, the invention includes structures having embedded piezoelectric elements for the sensing and control of internal stresses and control of the physical aspect of a structure.

Piezoelectric materials having the property of varying their dimensions in expansion/contraction upon the application of an electric field have long been used as motive elements. Thus, piezo benders, consisting of two identical piezoelectric plates joined along a common face and driven in opposing senses have been used for various purposes. There has been much recent work on applications of flexible structures obtained by embedding powdered polarizable piezoelectric materials in polymers, such as polyvinylenediflouride. In general, however, the uses of piezoelectric elements have been limited to their property of exhibiting a motion, or providing a stress of a known kind which is then incorporated in a conventional combination of other mechanical components. As such, the piezoelectric elements replace conventional elements such as electromagnetic solenoids or mechanical drive systems.

It has recently been proposed in U.S. Pat. No. 4,400,642 of Kiraly to form a structure having matrix layers and a plurality of embedded filaments in which either the matrix or the filaments are piezoelectrically active. That patent discusses in a general way the concept of controlling the shape, size and gross deflections of such a structure, and more specifically discusses applying static alternating control signals to the filaments to produce a static wave shape, or applying dynamic signals to induce a propagating deflection or "controlled wavetrain".

OBJECTS AND SUMMARY OF THE INVENTION

It is an object of the invention to provide a piezoelectrically controlled structural member of high stiffness adaptable to a variety of control regimens.

It is another object of the invention to provide a conductive structural member having insulated piezoelectric elements embedded therein.

It is another object of the invention to provide a laminated graphite composite structural member having piezoelectrical elements embedded therein, in such a way as to not alter the passive mechanical characteristics of the structural member.

It is a further object of the invention to provide such a structural member wherein pairs of piezoelectrical elements are placed about the neutral axis of the member.

It is a further object of the invention to provide a composite structure having defined resonance modes which may be electrically controlled.

These and other desirable features of the invention are obtained in a laminated composite structural member having a plurality of layers of structural material which together provide mechanical strength and integrity of the member. At least one piezoelectric element is embedded within the member and is responsive to electrical charges placed thereon for generating mechanical force.

In one aspect of the invention, the structural member is a tubular member which contains one or more round piezoelectric elements tightly fitted within the tube and bonded thereto. Radial or axial expansion of the piezoelectric element induces axial strain in the member, which may, for example, be part of a truss. In another aspect of the invention, the composite material is conductive, and an electrically insulated casing surrounds the piezoelectric element to insulate the piezoelectric element from conductive material in the layers while mechanically coupling the piezoelectric element thereto. The combined structural member enjoys the mechanical characteristics of a homogeneous structure.

In a preferred embodiment, the laminated composite material contains graphite fibers or other high modulus conducting fiber, and a matrix of epoxy or thermoplastic, and the piezoelectric components are formed of a ceramic material selected to have a modulus comparable to that of the cured composite material. A suitable insulated casing has been formed of a polyimide film. The composite structure is assembled by fitting the piezoelectric elements into apertures in epoxy-impregnated graphite fiber layers, and assembling the laminated structure and applying heat and pressure to cure the structure while reducing the thickness of the laminations to securely fit about the piezoelectric elements.

Prior to construction of the laminated structure, the resonance modes of the completed structure are calculated from its dimensions and known physical properties. The strain nodes for each mode are calculated, and the piezoelectric elements are then placed away from these nodes, in pairs at equal distances on opposing sides of the neutral axis of the structure. Each pair of elements serves as a piezoelectric moment actuator (PZA) to efficiently couple its motions to those of the composite structural member.

In preferred control systems according to the invention, a plurality of strain gauges are embedded at selected locations. The strain gauges develop signals from which the magnitudes of resonance modes are calculated. When an undesired vibrational mode is excited, control signals are applied to one or more PZA's to shift the resonant frequency, or increase the damping in the structure. Particular embodiments include optical instrument mountings, turbine blades, RF reflectors, helicopter rotors and other aerodynamic lift surfaces, robotic members, and human prosthetics.

BRIEF DESCRIPTION OF DRAWINGS

These and other features of the invention will be understood with reference to the drawings and the following discussion of illustrative embodiments.

DETAILED DESCRIPTION

The present invention contemplates the construction of a laminated composite structural member having embedded piezoelectric elements therein for controlling mechanical properties of the completed member. A preferred conductive composite material is an epoxy matrix graphite fiber filled material. One such composite is supplied as pre-impregnated sheets, from which structural members are fabricated by cutting the desired number of layers to the desired shape, overlaying layers with the fibers of some adjacent layers oriented in crossed orientation for strength, and curing the assembled structure for a characteristic time at an elevated curing temperature and pressure.

Applicant has found that problems arise in embedding piezoelectric elements in such a conductive matrix because the piezoelectric elements require a voltage difference across their opposing faces. The graphite fibers, being conductive, would shunt an embedded piezoelectric element, de-activating it unless the element were insulated. Moreover, the provision of electrical insulation between each piezoelectric element and the surrounding conductive fibers may be expected to impair the mechanical coupling between the two. Beyond this, applicant has identified a number of other difficulties in insulating the piezoelectric elements, which stem from the rigors of the high temperature pressurized cure cycle of conductive composites. Specifically, the high pressures applied during the cycle may cause graphite fibers to tear the insulating layer and short the piezoelectric elements. The high curing temperatures may soften or otherwise affect the insulators. Difficulties have also been encountered in the approach of encapsulating the elements in an epoxy insulating shell, because the shrinkage of the epoxy as it cools shatters the piezoelectric elements.

Applicant has found that by selecting a polyimide material as insulation and enshrouding a piezoelectric element with that material using a hard adhesive resin, the foregoing problems are overcome.

Figure 1:
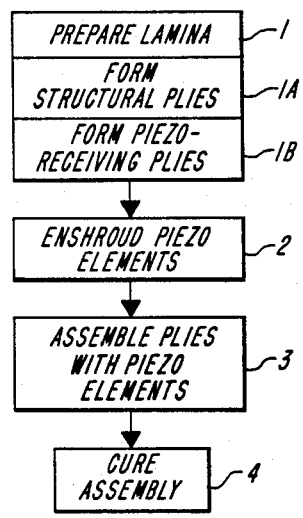
FIG. 1 shows the steps of a method of fabricating a structure according to the invention.

FIG. 1 shows applicant's method of constructing such a structural beam having embedded piezoelectric elements therein. As a first step 1, one prepares laminations of the conductive material used for forming the structural member. These consist of a first set 1A of laminations which conform generally to the desired contour of the finished structure and are free of holes or recesses. A second set 1B of layers is adapted to receive the piezoelectric elements, and consists of one or more layers having openings cut therein of a shape for receiving the piezoelectric elements. For a graphite fiber composite, the fibers are preferably oriented orthogonally in some adjacent layers, and for a rectangularly shaped piezoelectric element, are oriented parallel to the sides of the actuator opening. Because the layers will compress during the curing cycle, the length and width dimensions of the element-receiving openings conform fairly exactly to the element's dimensions, whereas the height dimension contains a percentage allowance for compression during curing. This added height also accommodates one or more insulation layers.

At a second step 2 the piezoelectric elements are enshrouded by coating with a curable resin, which preferably cures under the same conditions as the composite, and wrapping with one or more layers of insulating material. Applicant has found that a polyimide film manufactured by DuPont and sold under the trade name KAPTON, having a thickness in the range of two mils is a suitable insulator. The curable resin is preferably an acrylic resin, having a relatively high shear modulus for effectively coupling the piezoelectric element to the film. The conductive leads of the piezo elements are also insulated with Kapton or a similar material.

Once the piezo elements have been enshrouded with insulation, the structural member is assembled by an assembly step 3, by placing the first and second sets of layers in their respective positions, with the enshrouded piezoelectric elements located in their recesses within the second set of layers. Slits for the conductive leads of the piezoelectric elements are cut parallel to the direction of the fiber in the layers above and below the piezoelectric elements during this assembly. At step 4, the assembled structure is cured in accordance with the normal curing temperature and pressure for the composite. The curing results in compression of the impregnated layers, with the excess epoxy running off, so that the piezo elements become mechanically coupled to and integral with the composite structure.

Figure 2:
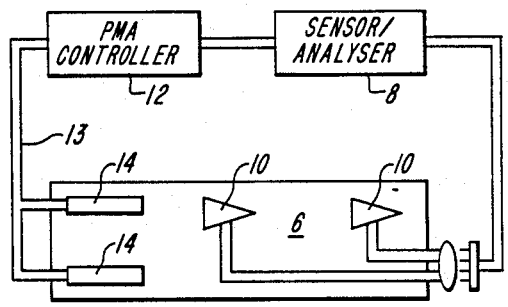
FIG. 2 shows a system for controlling a structural member according to the invention.

FIG. 2 shows a controllable structural member according to claim 1 in a control system. As shown, the system includes a controllable structural member 6 according to the invention having a sensing/analyzing circuit 8 connected to a first plurality of sensor elements 10, which may, for example, be piezoelectric sensing elements, or strain gauges of other sorts. Sensor/analyzer 8 communicates with a controller 12 which provides electrical control signals along conductive lines 13 to embedded piezoelectric elements 14 for controlling the mechanical properties of member 6. In one embodiment, a system as shown in FIG. 2 is a vibration damping system. The sensors 10 are placed such that the timing and magnitude of their outputs provides an indication of the amplitudes of vibrational resonance modes of the structure 6. Controller 12 responds to a sensed vibration by actuating one or more embedded piezoelectric elements 14 so as to shift the resonance modes of the structure when an amplitude sensed by a sensor 10 located at a characteristic region of strain of the undesired mode exceeds a selected threshold. This is accomplished by actuating the piezoelectric elements to locally vary the strain.

In another embodiment of the invention, the sensors 10 are used as feedback sensors for detecting vibration and synchronizing the controller to activate the embedded piezoelectric elements so as to cause a standing vibration in member 6 induced by periodic actuation of the piezoelectric elements 14. Such induced vibration may for example be useful in the control of air flow across the surface of the member 6.

In yet a third particular embodiment of the system of FIG. 2, the strain gauges 10 provide signals from which the sensor/analyzer 8 determines the magnitude of spatial displacement of member 6, as, for example, in a stressed cantilevered beam or a curved reflective surface. Controller 12 then controls the embedded elements 14 to alter the position of member 6.

The member 6 thus represents any of a number of structural members fabricated of a stiff composite material for which high authority control is desired. Member 6 may be, for example a turbine blade, or helicopter rotor or other aerodynamic surface, a robotic member, a human prosthetic, the mounting of an optical instrument, or an RF reflective surface.

Figure 3:
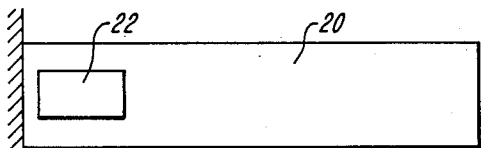
FIGS. 3-4 show views of an illustrative structural member constructed in accordance with the method of FIG. 1.
Figure 4:
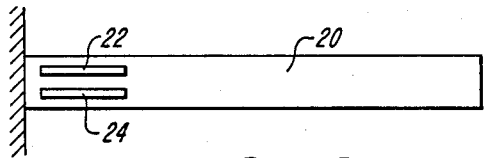

These and other aspects of systems according to the invention will be appreciated with reference to a discussion of FIGS. 3 and 4 which show respectively top and side views of a cantilevered beam structural member in accordance with the invention.

FIGS. 3 and 4 illustrate schematic views of a prototype graphite fiber composite beam 20 having embedded piezoelectric elements. Beam 20, which was thirty-five centimeters in length and five centimeters in width, with a thickness of 0.295 centimeters, was fabricated to perform dynamic mechanical tests of the efficacy and mechanical effect of embedded piezoelectric elements. Two piezoelectric elements 22, 24, having dimensions of 38.1×15.2×0.25 mm were embedded at equal distances from the centerline of the beam, extending along the beam between 10 and 48 mm from the root end. The elements were placed in regions of high average strain to achieve large modal force. For the cantilevered beam with a fixed endpoint, the lowest frequency mode is the first bending mode; the strain, which is obtained by twice differentiating the analytic expressions for the beam cantilever modes, is an everywhere-positive function decreasing with distance from the fixed end. The piezoelectric-elements were placed close to the root for maximum control effect.

Hereafter, the foregoing construction of a pair of piezoelectric elements placed in a region of high strain about the neutral axis of a structure is referred to as a "piezoelectric moment actuator" or PZA. In practice, each of the two elements is driven in opposing phases, resulting in the application of a local moment about the neutral axis. In the first bending mode of the cantilevered beam there are no strain nodes (or "zeroes"). More generally, however, applicant places the PZA's away from the calculated strain nodes of a structure. This will be more fully appreciated in connection with the discussion of FIG. 6, below.

Returning now to FIGS. 3 and 4, the prototype beam was fabricated of twenty-two layers of a graphite epoxy pre-impregnated material consisting of a $[0_2/90_7/0_2]$ symmetrical construction of Hercules AS4/3501-6 material. The piezoelectric elements were selected as G-1195 ceramics manufactured by Piezo Electric Products, having a Curie temperature of 360° C., and a large modulus of elasticity, $E_c = 63 \times 10^9$ N/m².

$E_c$ was approximately matched to that of the graphite composite material. The thickness of the piezoelectric elements was approximately equal to that of two plies of the graphite/epoxy material, which had five mil plies.

The piezoelectrics were fitted with 0.125 mm thick Kapton-insulated electric leads manufactured by Micromat; the piezoelectric-lead assembly was wrapped in Kapton film manufactured by Dupont, with the film bonded to the piezoelectric using a hard acrylic epoxy of a type which can cure during the regular cure cycle of the graphite/epoxy material; and the edges of the element were taped with Kapton tape. The insulated piezoelectric was then embedded inside the laminate. The piezoelectric thickness was twice the thickness of a nominal ply of graphite/epoxy, and the selected insulating film was two mils thick, so three graphite/epoxy plies were cut in order to make room for each insulated piezoelectric. The ceramics were embedded between the 4th and 8th and between the 15th and 19th plies. Slits for the leads were cut in the plies directly above and below the piezoelectrics. Finally, the laminated structure was cured using the manufacturer recommended cure cycle.

Figure 5:
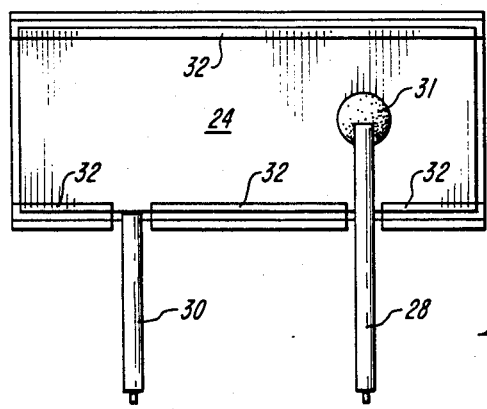
FIG. 5 is a view of a piezoelectric element before embedding in the member of FIGS. 3 and 4.

FIG. 5 shows a top view of a piezoelectric element 24 in the orientation of the element shown in FIG. 3, prepared for embedding. Element 24 has an upper insulated conductive lead 28 connected by a solder dot 31 to the top surface of the element 24, and a lower insulated conductive lead 30 similarly connected to the lower surface of the element. The entire element is enshrouded by cementing one or more layers of the Kapton film thereto with an acrylic cement, and Kapton tape 32 is wrapped around exposed edges of the element.

Applicant has found that the foregoing construction not only results in an insulated PZA which survives the fabrication process of a graphite/epoxy composite member, but results in the effective mechanical coupling of the PZA to the surrounding matrix. The acrylic cement prevents the insulator from forming a shear layer decoupling the PZA from the matrix, and the PZA itself does not alter the calculated modes of the structure.

Figure 6:
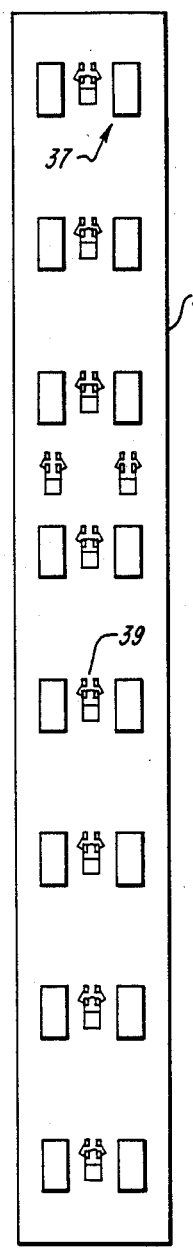
FIG. 6 shows a top view of a different structural member according to the invention.

FIG. 6 shows another prototype structural member 35 constructed according to the invention. Member 35 is a four foot by six inch graphite/epoxy beam employing the same ply configuration as that of beam 20. Eight PZA's 37 are spaced along the beam, each PZA 37 consisting of four piezoelectric elements symmetrically spaced about the neutral axis, with two elements in each of the upper and lower portions of the beam. As with the embodiment of FIGS. 3 and 4, the piezoelectric elements are located between the fourth and eighth plies of the upper $[0_2/90_7/0_2]$ laminations, and between the fifteenth and nineteenth plies of the lower laminations. The locations of the PZA's 37 were selected by calculating the first eight modes of the beam as a (suspended) free-free structure, determining the strain nodes of these modes, and placing the PZA's away from all calculated strain nodes. In the beam 35, the PZA's 37 were centered at positions spaced symmetrically on both sides from the twenty-four inch centerline of the beam by 2.8 inches, 8.1 inches, 13.6 inches, and 19.5 inches. For control and measurement, ten strain gauges 39 were attached along the beam between the actuators. This construction is illustrative of the fabrication of a structural member, and the manner of locating embedded piezoelectric elements in arbitrary structural members and structure control systems having structural members according to the invention.

Figure 7:
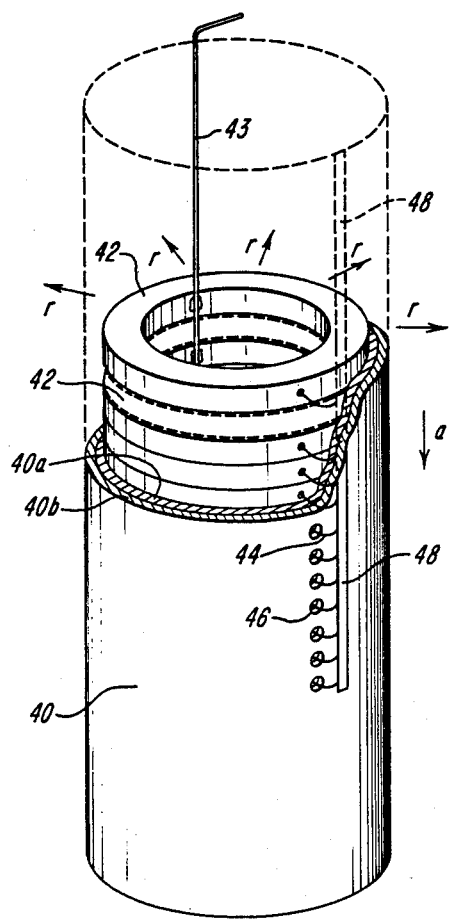
FIG. 7 shows a cutaway perspective view of a third structural member according to the invention.

FIG. 7 shows a third structural member having embedded piezoelectric elements according to applicant's invention. In this embodiment, a hollow composite member or tube 40 having two or more layers 40a, 40b ... surrounds one or more embedded round piezoelectric elements 42. The elements 42 are actuated by inner and outer conductive leads 43, 44, respectively, so as to radially expand and contract along direction "r" upon actuation thereof. Outer leads 44 are accessed through lead hole openings 46 and may connect, as shown to a lead bus 48. Applicant has found that with this structure, a radially outwardly directed strain along direction "r" transmitted to the member by expansion of piezoelectric element 42 efficiently induces an axiallydirected contraction of the member, along direction "a". In a similar fashion, axial strain of the piezoelectric element 42 is transmitted to cause axial strain of the structural member, with some component converted to radial strain. The magnitude of the axial-radial coupling is determined by the orientation of the fibers in the outer plies. This provides an embedded piezoelectric element structure which efficiently induces axial strain in a truss.

Member 40 may be fabricated of preformed composite tubing, with the piezoelectric elements 42 inserted therein and bonded thereto to form the complete truss member. For example, elements having a one mil clearance from the nominal internal diameter of a one inch diameter prefabricated tube may be used. Alternatively such a structure may be fabricated by wrapping preimpregnated composite sheets about the piezoelectric element and curing the entire assembly. If the truss is formed of conductive material, the piezoelectric element is preferably insulated therefrom, substantially as described for the embodiments of FIGS. 3-6. Alternatively, in some embodiments, the conductive tube may itself conduct the control signals to the outer electrode surface of the piezoelectric elements.

The invention being thus described, other examples and embodiments of the invention will occur to those skilled in the art, and all such embodiments and examples are within the spirit of the invention, as defined by the following claims.

What is claimed is:

1. A structure formed of plies of conductive composite material which is assembled and then hardened by curing at elevated temperature or pressure, such structure comprising an assembly of plural plies of conductive composite structural material arranged to form a body of said structure, at least one ply including a coupling face, a piezoelectric element incorporated within said body and having an electrically actuable surface bounded by said coupling face, and a film formed of electrically insulative sheet material located between the electrically actuable surface of said element and the coupling face for electrically insulating the surface from the conductive composite, said film being cemented to said electrically actuable surface with a cement which hardens during the curing of said plies of composite structural material to provide a mechanical shear coupling for the transmission of shear forces between the piezoelectric element and the coupling face, whereby said cured assembly forms a conductive structure of substantially homogeneous mechanical properties with a piezoelectric element effectively coupled to apply strain to the coupling face without shorting.

2. A structure according to claim 1, wherein a pair of piezoelectric elements are located on opposing sides of a neutral axis within said structure.

3. A structure according to claim 2, further comprising at least one strain gauge attached to the structure for sensing strain therein.

4. A structure according to claim 3, further comprising control means in communication with said at least one strain gauge and with at least one embedded piezoelectric element for actuating a said piezoelectric element in response to sensed strain so as to control said composite structure.

5. A structure according to claim 4, wherein said control means includes means for actuating a said piezoelectric element to shift the stiffness or damping of said structure.

6. A structure according to claim 5, having a surface shaped as an aerodynamic lifting surface.

7. A structure according to claim 1, wherein said film is a polyimide.

8. A structure according to claim 1, wherein said member is an airfoil.

9. A structure according to claim 1, wherein said member is a structural support member.

10. A controllable composite structure according to claim 1, further comprising control means for applying an electrical control signal to said conductive means to produce said strain.

11. A structure according to claim 1, wherein said plies are arranged to form a tubular member having an interior surface at least a portion of which constitutes said coupling face, wherein said piezoelectric element is located within the tubular member, and said electrically actuable surface is a round surface mating with said coupling face and further comprising conductive means for actuating the piezoelectric element for controlling the structural member.

* * * * *